United States Patent [19]

Kawanishi et al.

[11] Patent Number: 5,232,860
[45] Date of Patent: Aug. 3, 1993

[54] METHOD OF FLEXIBLE PHOTOVOLTAIC DEVICE MANUFACTURE

[75] Inventors: Yasuyoshi Kawanishi; Osamu Takahashi; Masatoshi Otsuki; Kenzi Sawada, all of Sumoto, Japan

[73] Assignee: Sanyo Electric Co., Ltd., Osaka, Japan

[21] Appl. No.: 851,785

[22] Filed: Mar. 16, 1992

[30] Foreign Application Priority Data

Mar. 28, 1991 [JP] Japan ................................. 3-64816

[51] Int. Cl.$^5$ ............................................. H01L 31/18
[52] U.S. Cl. .............................................. 437/2; 437/4; 437/966; 136/256
[58] Field of Search .................. 437/4, 195, 181, 966, 437/974, 925, 214; 148/DIG. 135; 204/192.26–192.29; 136/244, 245, 251, 259

[56] References Cited

U.S. PATENT DOCUMENTS

| | | | |
|---|---|---|---|
| 3,694,337 | 1/1971 | Kushihashi et al. | 204/192.27 |
| 4,497,700 | 2/1985 | Groth et al. | 204/192.27 |
| 4,565,772 | 1/1986 | Takeoka et al. | 204/192.26 |
| 4,799,745 | 1/1989 | Meyer et al. | 204/192.27 |
| 5,106,713 | 4/1992 | Law | 430/59 |

FOREIGN PATENT DOCUMENTS

| | | |
|---|---|---|
| 61-85872 | 5/1986 | Japan . |
| 63-107073 | 5/1988 | Japan . |
| 63-261761 | 10/1988 | Japan . |
| 1-105581 | 4/1989 | Japan . |

*Primary Examiner*—Olik Chaudhuri
*Assistant Examiner*—Loc Q. Trinh
*Attorney, Agent, or Firm*—Wenderoth, Lind & Ponack

[57] ABSTRACT

A method of flexible photovoltaic device manufacture in which an inorganic separation layer and inorganic first protective film layer are formed on a supporting substrate. On the inorganic first protective film, a first electrode, an amorphous silicon photovoltaic layer, a second electrode, and a second protective film are formed in that order. Then the supporting substrate and the inorganic separation layer are separated. The inorganic separation layer is a material that bonds weakly with both the supporting substrate and the inorganic first protective film.

5 Claims, 2 Drawing Sheets

Fig. 3 PRIOR ART

| 36 | PROTECTIVE RESIN |
|---|---|
| 35 | METAL ELECTRODE LAYER |
| 34 | AMORPHOUS SILICON LAYER |
| 33 | TRANSPARENT ELECTRODE LAYER |
| 32 | HEAT RESISTANT TRANSPARENT RESIN |
| 31 | GLASS SUPPORTING SUBSTRATE |

SEPARATION → (between 32 and 31)

Fig. 4

| 7 | SECOND PROTECTIVE FILM |
|---|---|
| 6 | SECOND ELECTRODE |
| 5 | AMORPHOUS SILICON PHOTOVOLTAIC LAYER |
| 4 | FIRST ELECTRODE |
| 3 | INORGANIC FIRST PROTECTIVE FILM |
| 2 | INORGANIC SEPARATION LAYER |
| 1 | SUPPORTING SUBSTRATE |

SEPARATION → (between 3 and 2)
SEPARATION → (between 2 and 1)

METHOD OF FLEXIBLE PHOTOVOLTAIC DEVICE MANUFACTURE

BACKGROUND OF THE INVENTION

This invention relates to a method of manufacture of light weight, flexible, thin film photovoltaic devices.

A method of flexible photovoltaic device manufacture is described in Japanese public disclosure 85872 (1986). As shown in FIG. 1, the method described in this disclosure has a glass substrate 11 on which a metal layer 12 is formed to serve as a back electrode. On top of the metal layer 12, an amorphous silicon layer 13 and a transparent surface electrode 14 provided with ITO layer and a collector, are formed in that order. The glass substrate is then separated from the photovoltaic device. Metals such as stainless steel, chrome, and silver are used as back electrodes for the metal layer 12. Stainless steel and chrome metal layers 12 have the drawback that they do not separate well from the glass substrate. Because of this, even separation of the glass substrate 11 is difficult and not practical. On the other hand, the glass substrate 11 separates well when the metal layer is silver. However, silver has the drawback that it diffuses into the amorphous silicon layer 13 when it is formed on the silver metal layer 12 and degrades performance as a photovoltaic device.

Japanese public disclosure 105581 (1989) describes a method for eliminating these types of drawbacks. As shown in FIG. 2, the method described in this disclosure has a supporting substrate 21 on which a polyimide resin layer as the first resin layer 22, a transparent electrode layer 23, an amorphous silicon semiconductor layer 24, a backside metal electrode layer 25, and a second resin layer 26 are formed. The supporting substrate 21 is then separated from the first resin layer 22 by immersion in water.

However, because the separation layer is the first resin layer 22 which is a polyimide resin layer, this method has the following drawbacks.

① Polyimide resin can withstand heat up to a maximum of about 300° C. For this reason, tin oxide (SnO$_2$) film which has a formation temperature of 600° C. cannot be put on the first resin layer 22. Consequently, tin oxide with low resistivity and high optical transmissivity cannot be used, and some high resistivity conductor must be used in its place.

② When the multilayered structure is separated from the supporting substrate 21, the separation is uneven and repeatability is poor.

③ Because the first resin layer readily absorbs water, it generates gas within the vacuum chamber during formation of the photoelectric layer. This gas becomes incorporated into the photoelectric layer and degrades film quality.

Further, as shown in FIG. 3, Japanese public disclosure 107073 (1988) describes a method of photoelectric device manufacture with a glass supporting substrate 31 on which a heat resistant transparent resin layer 32, a transparent electrode layer 33, an amorphous silicon layer 34, a metal electrode layer 35, and a protective resin 36 are formed in that order. This multilayered structure is immersed in water causing separation between the glass substrate 31 and the heat resistant resin 32.

Since the method of manufacture described in this public disclosure also attaches synthetic resin onto a glass supporting substrate, it has drawbacks similar to those of the method shown in FIG. 2. Namely, since this method attaches transparent synthetic resin 32 onto the glass supporting substrate 31, it is not simple to grow a high formation temperature tin oxide (SnO$_2$) film as the transparent electrode layer. It is also not simple to separate the heat resistant transparent resin 32 from the glass supporting substrate 31. Further, during formation of the amorphous silicon layer, out-gassing within the vacuum chamber degrades the film quality of the photovoltaic layer.

The present invention provides a thin film photovoltaic device with exceptional flexibility that can be easily separated from the supporting substrate without immersion of the multilayered structure in water.

SUMMARY OF THE INVENTION

The method of flexible photovoltaic device manufacture of this invention is characterized by forming an inorganic separation layer with good separation properties on a supporting substrate, and then forming an inorganic first protective film on the inorganic separation layer. On top of the inorganic first protective film a first electrode, an amorphous silicon photovoltaic layer, a second electrode, and a second protective film are formed in that order. Then the supporting substrate is separated via the inorganic separation layer. The inorganic separation layer is chosen to be a material such as lead (Pb), tin (Sn), indium (In), zinc (Zn), silver (Ag), silicon (Si), or tin oxide (SnO$_2$) that does not bond strongly with either the supporting substrate or the inorganic first protective film.

BRIEF DESCRIPTION OF THE DRAWINGS

FIG. 1 through FIG. 3 are cross-sectional views of prior art photovoltaic devices during manufacture.

FIG. 4 is a cross-sectional view of a photovoltaic device during manufacture by the method of the present invention.

DETAILED DESCRIPTION OF THE INVENTION

Figure 1:
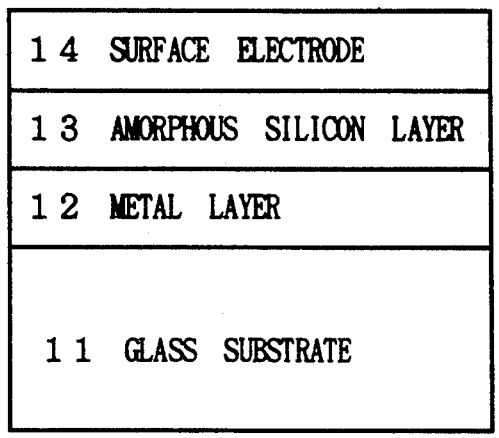
Figure 2:
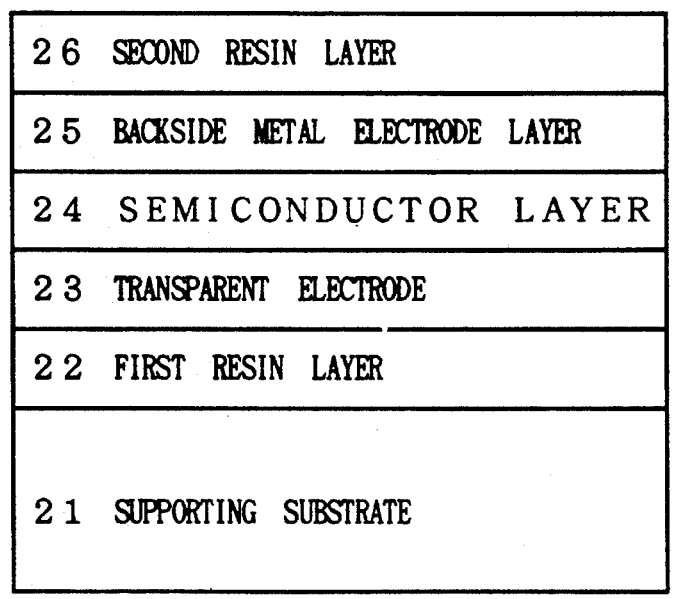

The following describes an embodiment of the present invention based on illustrations. Turning to FIG. 4, 1 refers to a supporting substrate of glass or similar material. A lead inorganic separation layer 2 is formed on the supporting substrate 1 by electron beam deposition. Then silicon dioxide as the inorganic first protective film 3, tin oxide as the transparent electrode 4, and p-type, i-type, and n-type amorphous silicon as the photovoltaic layer 5 are formed in that order. Further, a second electrode 6 is formed on the amorphous silicon photovoltaic layer 5, and a laminate film as a second protective film 7 is applied over the second electrode 6.

After these film formation processes, the supporting substrate 1 is detached. The lead inorganic separation layer 2 has good separation properties with respect to the supporting substrate 1 and the inorganic first protective film 3. In particular, the lead inorganic separation layer 2 detaches better from the silicon dioxide inorganic first protective film 3 than from the green plate glass supporting substrate 1. Therefore, when the supporting substrate 1 is detached, separation occurs between the inorganic separation layer 2 and the silicon dioxide inorganic first protective film 3. Since the silicon dioxide of the inorganic first protective film 3 is transparent to light, a photovoltaic device can be obtained which has the inorganic first protective film 3 on the incident light side of the device.

It is desirable to form the inorganic first protective film 3 on the inorganic separation layer 2 without adding heat to the substrate. If heat is added to the substrate, not only does bonding between the inorganic first protective film's silicon dioxide and the inorganic separation layer get stronger, making separation difficult, but the silicon dioxide also attaches to the supporting substrate 1 through the inorganic separation layer 2, making separation even more difficult.

For the case where the amorphous silicon photovoltaic layer is formed in the order n-type, i-type then p-type, the second electrode 6 and the second protective film 7 are made transparent to light. For this case as well, when the amorphous silicon photovoltaic layer 5 is removed from the supporting substrate 1, separation occurs between the inorganic separation layer 2 and the inorganic first protective film 3. For this device type, energy conversion efficiency is better with the second protective film 7 side used as the incident light side of the device. Regardless of the type of the amorphous silicon photovoltaic layer 5, materials such as tin (Sn), indium (In), zinc (Zn), silver (Ag), silicon (Si), or tin oxide ($SnO_2$) can be used besides lead as an inorganic separation layer which detaches well from both the supporting substrate and the inorganic first protective film. In addition, alumina can be used in place of silicon dioxide for the inorganic first protective film.

This method of flexible photovoltaic device manufacture has the feature that a light weight, thin, and flexible photovoltaic device can be easily manufactured. This is because the amorphous silicon photovoltaic layer is formed on the supporting substrate via an inorganic separation layer and inorganic first protective film. After formation, the supporting substrate is removed to yield the photovoltaic device.

Further, in this method, even if some heat is added during transparent electrode and amorphous silicon photovoltaic layer formation, outgassing from metals such as lead used as the inorganic separation layer does not occur, and energy conversion efficiency is not reduced by film quality degradation in the photovoltaic layer.

Still further, since the surface of the inorganic separation layer is covered with the inorganic first protective film, no lead or other metal from the inorganic separation layer penetrates into the first electrode when it is formed, nor does the opposite diffusion from the first electrode occur. In addition, because the inorganic first protective film acts as a protective layer for the photovoltaic device, a very durable photovoltaic device can be produced.

Moreover, since the amorphous silicon photovoltaic layer and electrodes are formed on an inorganic separation layer and inorganic first protective film rather than on synthetic resin, there is no temperature restriction for transparent electrode formation. Therefore, transparent electrodes with low resistivity and high light transmissivity can be formed.

We claim:

1. A method of manufacturing a flexible photovoltaic device comprising an inorganic first protective film, a first electrode, an amorphous silicon photovoltaic layer, a second electrode and a second protective film, which method comprises:
   (a) forming, on a supporting substrate, an inorganic separation layer which bonds weakly with respect to both said supporting substrate and said inorganic first protective film;
   (b) forming said inorganic first protective film on said inorganic separation layer;
   (c) forming the following layers on said inorganic first protective film in the following order
      (1) said first electrode,
      (2) said amorphous silicon photovoltaic layer,
      (3) said second electrode, and
      (4) said second protective film; and
   (d) thereafter removing said supporting substrate and said inorganic separation layer from said inorganic first protective film.

2. A method as recited in claim 1 wherein said inorganic separation layer is lead (Pb), tin (Sn), indium (In), zinc (Zn), silver (Ag), silicon (Si), or tin oxide ($SnO_2$).

3. A method as recited in claim 1 wherein said inorganic first protective film and said first electrode are transparent to light.

4. A method as recited in claim 1 wherein said inorganic first protective film is silicon dioxide.

5. A method as recited in claim 1 wherein said inorganic first protective film is alumina.

* * * * *